US006754054B2

(12) United States Patent
Seigler et al.

(10) Patent No.: US 6,754,054 B2
(45) Date of Patent: Jun. 22, 2004

(54) SPIN VALVE READ ELEMENT USING A PERMANENT MAGNET TO FORM A PINNED LAYER

(75) Inventors: Michael A. Seigler, Pittsburgh, PA (US); Paul E. Anderson, Eden Prairie, MN (US); Alexander M. Shukh, Savage, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 10/270,873

(22) Filed: Oct. 15, 2002

(65) Prior Publication Data

US 2003/0039081 A1 Feb. 27, 2003

Related U.S. Application Data

(63) Continuation-in-part of application No. 09/757,845, filed on Jan. 10, 2001.
(60) Provisional application No. 60/175,272, filed on Jan. 10, 2000.

(51) Int. Cl.[7] .............................. G11B 5/27; G11B 5/66
(52) U.S. Cl. ................................................. 360/324.11
(58) Field of Search ......................... 360/324.1, 324.11, 360/324.12; 324/252

(56) References Cited

U.S. PATENT DOCUMENTS

| | | | | |
|---|---|---|---|---|
| 3,996,095 A | * | 12/1976 | Ahn et al. ................... | 360/131 |
| 5,465,185 A | | 11/1995 | Heim et al. | |
| 5,708,358 A | | 1/1998 | Ravipati | |
| 5,759,681 A | * | 6/1998 | Hosoe et al. ................ | 360/126 |
| 5,874,886 A | * | 2/1999 | Araki et al. ............... | 338/32 R |
| 5,917,400 A | | 6/1999 | Fujikata et al. | |
| 6,023,395 A | * | 2/2000 | Dill et al. ................. | 360/324.2 |
| 6,063,491 A | * | 5/2000 | Fujikata et al. ........ | 360/324.11 |
| 6,084,405 A | | 7/2000 | Suzuki | |
| 6,134,091 A | | 10/2000 | Toki et al. | |
| 6,175,476 B1 | * | 1/2001 | Huai et al. ............. | 360/324.11 |
| 6,215,631 B1 | * | 4/2001 | Fujikata et al. ........ | 360/324.11 |
| 2001/0012187 A1 | | 8/2001 | Lai et al. | |

OTHER PUBLICATIONS

Yimin Gou et al., "Study of SAL–Biased MR Heads With Patterned Permanent Magnet Bias", *IEEE Trans. On Magn.*, vol. 30, No. 6, pp. 3861–3863 (Nov. 1994).
Simon H. Liao et al., "Stability and Biasing Characteristics of a Permanent Magnet Biased SAL/MR Device", *IEEE Trans. On Magn.*, vol. 30, No. 6, pp. 3855–3857 (Nov. 1994).
H. Uwazumi et al., "Recording Performance of CoCrPt–(Ta, B)/TiCr Perpendicular Recording Media", *IEEE Trans. On Magn.*, vol. 37, No. 4, pp. 1595–1598 (Jul. 2001).

* cited by examiner

*Primary Examiner*—George J. Letscher
*Assistant Examiner*—C R Magee
(74) *Attorney, Agent, or Firm*—Benjamin T. Queen, II, Esq.; Robert P. Lenart, Esq.; Pietragallo, Bosick & Gordon

(57) ABSTRACT

A spin valve read element for use with, for example, magnetic recording media, includes a permanent magnet as one of the multilayers that make up the spin valve. The spin valve may also include a pinned ferromagnetic layer, an antiferromagnetic coupling inducing layer, a reference ferromagnetic layer, an electroconductive layer, and/or a free ferromagnetic layer. Epitaxy breaking layers may also be advantageously positioned within the spin valve. The multilayers of the spin valve may be constructed as a current perpendicular to the plane or a current parallel to the plane type spin valve.

23 Claims, 9 Drawing Sheets

SPIN VALVE READ ELEMENT USING A PERMANENT MAGNET TO FORM A PINNED LAYER

CROSS REFERENCE TO RELATED APPLICATIONS

This application is a continuation-in-part application of U.S. Non-Provisional patent application Ser. No. 09/757,845 filed Jan. 10, 2001 which claims the benefit of U.S. Provisional Patent Application No. 60/175,272 filed Jan. 10, 2000.

BACKGROUND OF THE INVENTION

1. Field of the Invention

The present invention relates to magnetic structures. More specifically, the invention relates to spin valve read elements that may be used in magnetic recording heads.

2. Description of the Related Art

Spin valves for reading from magnetic recording media, i.e., for sensing a magnetic field, have been used to overcome the limited sensitivity of inductive reading. A spin valve may comprise a pair of ferromagnetic layers having a nonmagnetic layer therebetween, with an antiferromagnetic layer adjacent to one of the ferromagnetic layers. The antiferromagnetic layer is a material that is generally not affected by external magnetic fields, and is therefore generally considered to be nonmagnetic. However, the material has been given a permanent magnetic orientation through exposure to magnetic fields at high temperature. The magnetization in the ferromagnetic layer closest to the antiferromagnetic layer will align itself with the magnetic field in the closest layer of the antiferromagnetic material. The combination of the ferromagnetic layer and adjacent antiferromagnetic layer is commonly known as the pinned layer, with the opposite ferromagnetic layer known as the free layer. When the spin valve is exposed to a magnetic field, the magnetic orientation within the free layer will change to correspond with this magnetic field. This relative change in the orientation of the magnetizations within the free layer will alter the spin dependent scattering of conduction electrons, thereby increasing or decreasing the resistance of the spin valve to an applied test current. Parallel magnetic orientations of the ferromagnetic layers corresponds to minimum resistance, and anti-parallel orientations of these magnetic moments corresponds to maximum resistance. A constant level of resistance, whether the minimum or maximum, indicates a binary "0." A change in the level of resistance indicates a binary "1."

Antiferromagnetic materials have several disadvantages when used within read elements. Most antiferromagnetic materials have poor corrosion resistance. The high temperature process used to induce antiferromagnetic properties in antiferromagnetic materials causes diffusion between the thin layers of a typical read element, thereby degrading performance. This anneal may limit the choice of materials that can be used in other parts of the head that will also be subjected to this anneal. Additionally, antiferromagnetic properties are subject to temperature, and will typically no longer effectively pin the layer of the adjacent ferromagnetic material at temperatures at or above 300° C.

In addition, spin valves also have disadvantages that are inherent in their basic structure. For example, magnetic flux from the pinned layer, and specifically the magnetic flux from the ferromagnetic portion of the pinned layer, affects the free layer magnetic orientation. This affects the ability of the free layer to properly operate in the presence of the magnetic field that is being sensed by the spin valve and, therefore, results in a reduced effectiveness of the read element that employs a spin valve arrangement.

There is identified, therefore, a need for an improved spin valve read element that overcomes limitations, disadvantages, and/or shortcomings of known spin valve read elements. There is also identified a need for an improved magnetic structure that overcomes limitations, disadvantages, and/or shortcomings of known magnetic structures.

SUMMARY OF THE INVENTION

The present invention relates to a spin valve used, for example, for reading from magnetic recording media, wherein the antiferromagnetic layer has been replaced by a permanent magnet.

The present invention includes a recording head combining a read portion and a write portion. The write portion may be of either perpendicular or longitudinal configuration. A perpendicular recording head may include a main pole, an opposing pole magnetically coupled to the main pole, and an electrically conductive coil adjacent to the main pole. The bottom of the opposing pole may have a surface area greatly exceeding the surface area of the main pole's tip. Likewise, a typical longitudinal recording head includes a pair of poles, with a coil adjacent to one pole. Unlike a perpendicular recording head, a longitudinal recording head may use poles having bottom surfaces with substantially equal areas. In either case, electrical current flowing through the coil creates a flux through the main pole. The direction of the flux may be reversed by reversing the direction of current flow through the coil. The opposing pole of the perpendicular head (or the first pole of the longitudinal head) can also form one of two substantially identical shields for the read elements. The shields are substantially parallel to the trackwidth, with the read element disposed between these shields. A read element of the present invention is a spin valve wherein the antiferromagnetic layer has been replaced by a permanent magnet.

One embodiment of the spin valve includes a permanent magnet, followed by a pinned ferromagnetic layer, an Ru layer, a reference ferromagnetic layer, an electroconductive layer (for example, copper) and a free ferromagnetic layer. Another preferred embodiment includes a permanent magnet, an Ru layer, a pinned ferromagnetic layer, a copper layer, and a free ferromagnetic layer. Another embodiment includes a permanent magnet, a pinned ferromagnetic layer, a Ta layer, a Ru layer, a reference ferromagnetic layer, a copper layer, and a free ferromagnetic layer. Current may be applied parallel or perpendicular to the plane for embodiments of the invention.

To read from the magnetic recording medium, the recording head is separated from the magnetic recording medium by the flying height. The magnetic recording medium is moved past the recording head so that the recording head follows the tracks of the magnetic recording medium, typically with the magnetic recording medium first passing under one shield, followed by the read element, then passing under the write portion of the recording head. As the magnetic recording medium passes under the read element, the magnetic fields within the recording medium orient the magnetic moment within the free ferromagnetic layer of the spin valve so that they are either parallel (corresponding to minimum resistance) or antiparallel (corresponding to maximum resistance), relative to the pinned ferromagnetic layer depending on the direction of the magnetic field being read from the recording medium. A sense current is passed through the GMR element by a pair of electrical contacts, thereby enabling the read element's resistance to be detected. A constant level of resistance may be read as a binary "0," and a changing resistance may be read as a binary "1."

Presently available spin valves utilize, for example, an antiferromagnetic layer adjacent to a ferromagnetic layer, followed by an electroconductive layer and another ferromagnetic layer. The combination of the antiferromagnetic layer and adjacent ferromagnetic layer forms a pinned layer, although sometimes the adjacent ferromagnetic layer alone is referred to as the pinned layer. The antiferromagnetic material is one which is not generally affected by external magnetic fields, but which can be given a magnetic orientation once subjected to a magnetic field at high temperature. The adjacent ferromagnetic layer will have a magnetic orientation parallel to the orientation of the magnetic orientation in the closest layer of the antiferromagnetic layer. The ferromagnetic layer on the other side of the electroconductive material is known as the free layer, and the orientation of its magnetic moment will vary based on the magnetic fields to which it is subjected.

Antiferromagnetic materials have important disadvantages. They typically have poor corrosion resistance. They typically lose their antiferromagnetic properties at temperatures at or above 300° C. The high temperature heating process used to induce antiferromagnetic properties can cause diffusion between the thin layers of the read elements, thereby destroying its magnetoresistive properties. The high temperature anneal also limits the choice of materials for other parts of the head that will also be subjected to this anneal. A spin valve of the present invention avoids these disadvantages by substituting a permanent magnet for the antiferromagnetic material.

In accordance with an aspect of the invention, a spin valve includes a permanent magnet layer, a reference ferromagnetic layer, and a free ferromagnetic layer. A coupling inducing layer, that provides antiferromagnetic coupling, is positioned between the permanent magnet layer and the reference ferromagnetic layer. An electroconductive layer is positioned between the free layer and the reference ferromagnetic layer. The coupling inducing layer may be formed of, for example, Ru, Rh and Cr. The electroconductive layer may be formed of, for example, Cu, Au, Ag or an alloy consisting of at least one of Cu, Au or Ag.

The spin valve may also include a pinned ferromagnetic layer positioned between the permanent magnet layer and the coupling inducing layer. In addition, the spin valve may include an epitaxy breaking layer positioned, for example, between the coupling inducing layer and the pinned ferromagnetic layer and/or an epitaxy breaking layer positioned between the coupling inducing layer and the reference ferromagnetic layer. The epitaxy breaking layer may be formed of, for example, Ta, Zr or Nb.

The spin valve may also include a seed layer positioned adjacent the permanent magnet, such that the seed layer is formed on an opposing side of the permanent magnet layer from the side on which the coupling inducing layer is positioned. The seed layer may be formed of, for example, Cr, W, TiW or MgO. The spin valve may also include a flux shunt layer and an epitaxy breaking layer positioned between the flux shunt layer and the seed layer. The flux shunt layer may be formed of, for example, NiFe, CoFe, NiCoFe or an alloy containing at least one of the elements Co, Ni or Fe.

In accordance with another aspect of the invention, a magnetic disc drive storage system includes a housing, a rotatable magnetic storage medium positioned in the housing, and a recording head mounted in the housing adjacent the rotatable magnetic storage medium. The recording head includes a spin valve wherein the spin valve may be constructed in accordance with the spin valve embodiments described herein. In addition, the spin valve may be constructed as a current perpendicular to the plane type spin valve or a current parallel to the plane type spin valve.

In accordance with yet another aspect of the invention, a current perpendicular to the plane (CPP) spin valve includes a permanent magnet layer, a pinned ferromagnetic layer adjacent the permanent magnet layer, and an antiferromagnetic coupling inducing layer adjacent the pinned ferromagnetic layer. The CPP spin valve may also include a reference ferromagnetic layer adjacent the antiferromagnetic coupling inducing layer and an electroconductive layer adjacent the reference ferromagnetic layer. A free ferromagnetic layer may be positioned adjacent the electroconductive layer. In addition, an epitaxy breaking layer may be positioned between the pinned ferromagnetic layer and the antiferromagnetic coupling inducing layer and/or between the antiferromagnetic coupling inducing layer and the reference ferromagnetic layer and/or between the permanent magnet layer and the pinned layer.

In accordance with an additional aspect of the invention, a magnetic device comprises a multilayer magnetic structure including a permanent magnet layer, a reference ferromagnetic layer, and a free ferromagnetic layer. The magnetic structure may also include a pinned ferromagnetic layer positioned between the permanent magnet layer and a coupling inducing layer. In addition, the magnetic structure may include one or more epitaxy breaking layers. The magnetic structure may be utilized in a magnetic recording head or in other applications where it may be advantageous to employ such a multilayer magnetic structure such as, for example, in a magnetoresistive random access memory device.

It is an aspect of the present invention to provide a spin valve avoiding the disadvantages of antiferromagnetic material.

It is another aspect of the present invention to provide a spin valve having a permanent magnet, a pinned ferromagnetic layer, an antiferromagnetic coupling layer, a reference ferromagnetic layer, an electroconductive layer, and a free ferromagnetic layer.

It is a further aspect of the present invention to provide a spin valve having a permanent magnet, an antiferromagnetic coupling layer, a pinned ferromagnetic layer, an electroconductive layer, and a free ferromagnetic layer.

It is another aspect of the present invention to provide a spin valve having a permanent magnet, a pinned ferromagnetic layer, a Ta layer, an antiferromagnetic coupling layer, a reference ferromagnetic layer, an electroconductive layer, and a free ferromagnetic layer.

It is a further aspect of the present invention to provide a spin valve avoiding the use of corrosive materials.

It is a further aspect of the present invention to provide a spin valve whose properties will not be compromised by high temperature.

It is another aspect of the present invention to provide a read element having a manufacturing process that does not result in diffusion of the read element's layers.

These and other aspects of the present invention will become apparent through the following description and drawings.

BRIEF DESCRIPTION OF THE DRAWINGS

Like reference numbers denote like elements throughout the drawings.

DETAILED DESCRIPTION OF THE PREFERRED EMBODIMENTS

The invention relates to a multilayer magnetic structure, e.g., a spin valve having a permanent magnet forming the pinned layer. Such a spin valve is particularly useful as a read element for use in recording heads for magnetic recording. However, it will be appreciated that the multilayer magnetic structure of the invention may have applications other than magnetic recording where it may be advantageous to employ such a structure such as, for example, in a magnetoresistive random access memory (MRAM) device.

Figure 1:
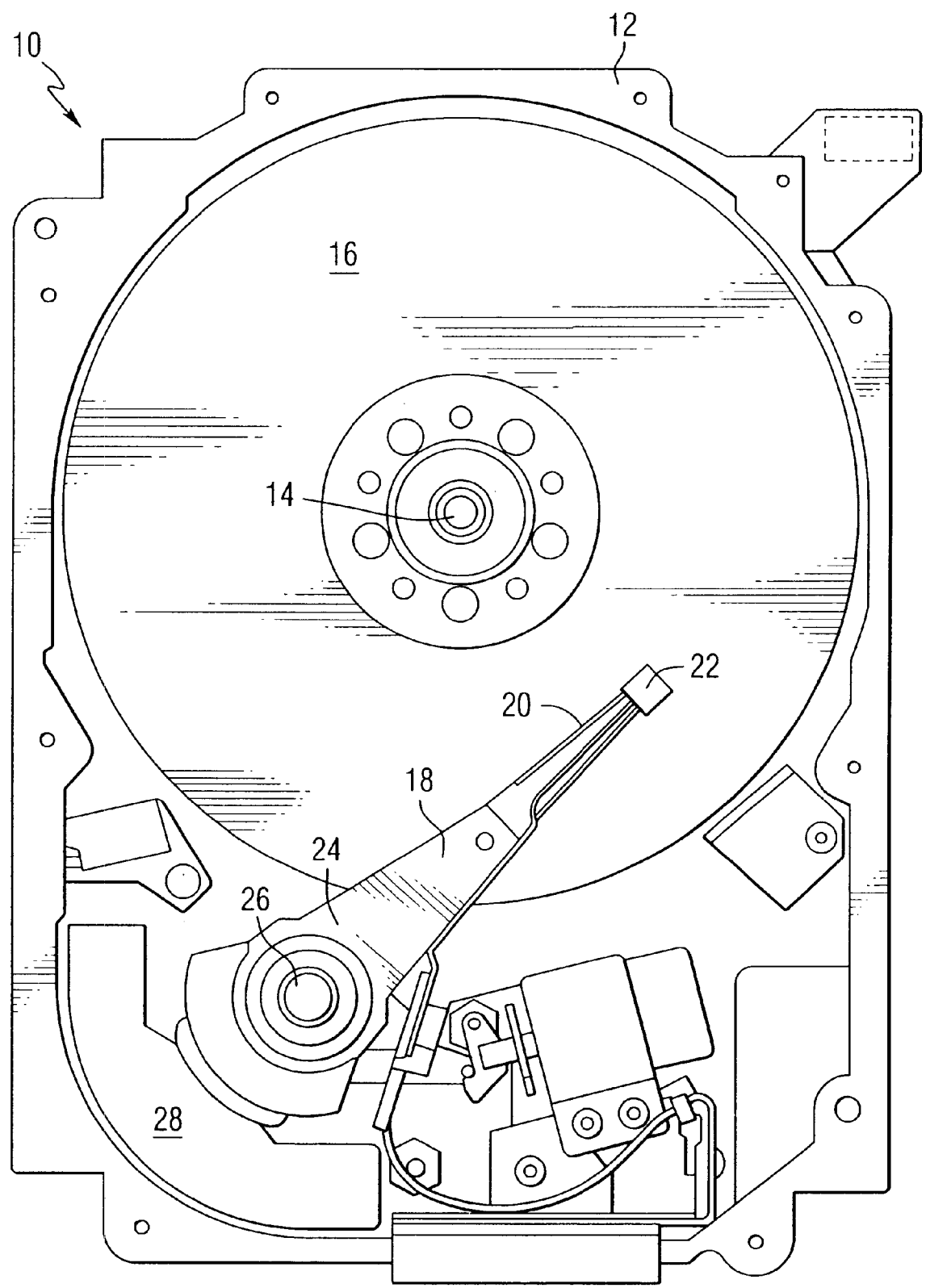
FIG. 1 is a top view of a typical hard disc drive for a computer for which the present invention may be used, illustrating the disc drive with its upper housing portion removed.

In one embodiment, the invention may be used within a fixed disc drive 10 for computers, one of which is illustrated in FIG. 1. The fixed disc drive 10 includes a housing 12 (with the upper portion removed and the lower portion visible in this view for maximum clarity) dimensioned and configured to contain and locate the various components of the disc drive 10. The disc drive 10 includes a spindle motor 14 for rotating at least one magnetic storage medium 16 within the housing, in this case a magnetic disc. At least one arm 18 is contained within the housing 12, with each arm 18 having a first end 20 with a recording head or slider 22, and a second end 24 pivotally mounted to a bearing 26. An actuator motor 28, such as a movable coil DC motor, is located at the arm's second end 24, pivoting the arm 18 to position the head 22 over a desired sector of the disc 16. The actuator motor 28 is regulated by a controller which is not shown and which is well known.

Figure 2:
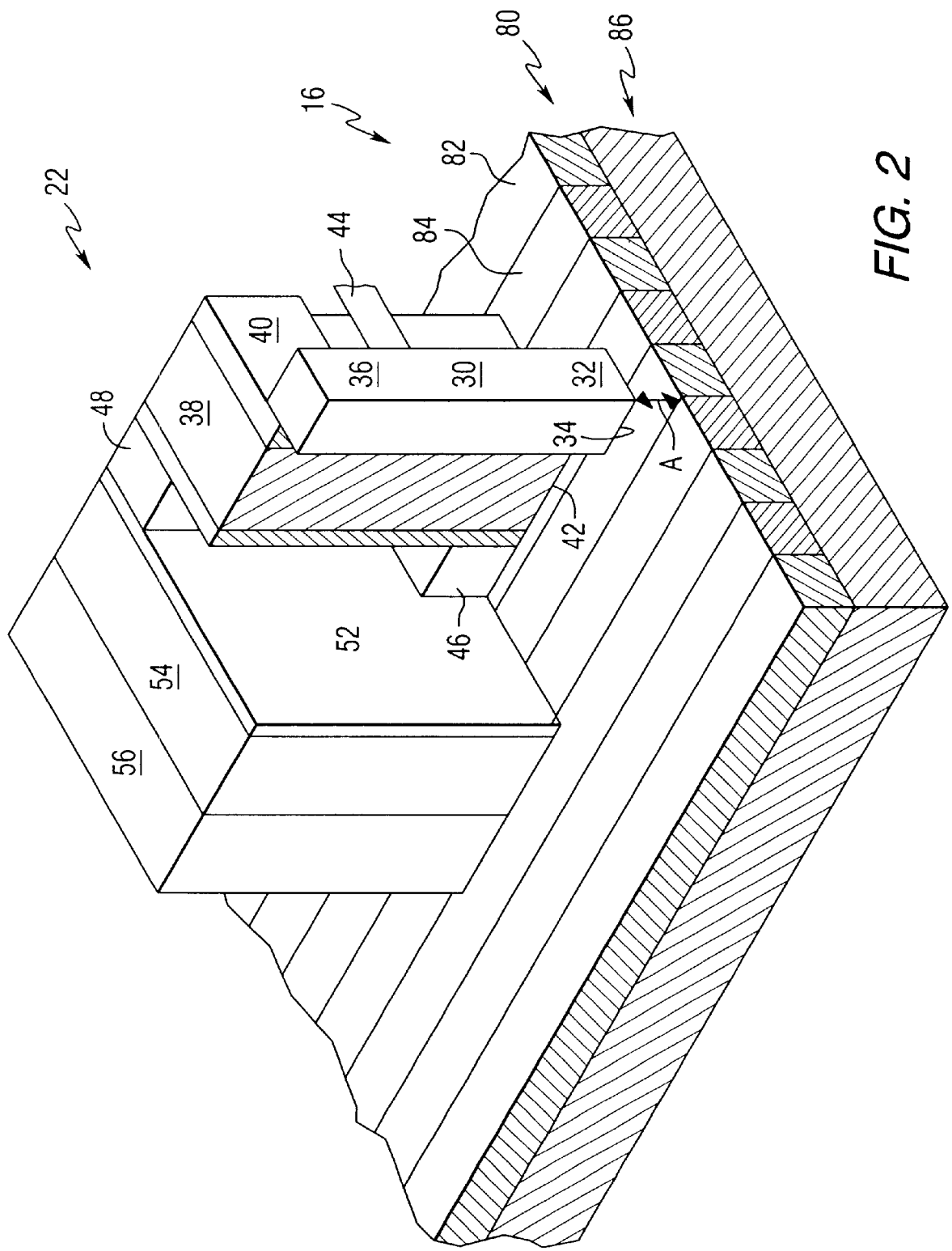
FIG. 2 is a partially sectioned, partially schematic isometric view of an embodiment of a recording head according to the present invention.

Referring to FIG. 2, an example of a recording head 22 of the present invention is illustrated. The recording head 22 includes a magnetically permeable main pole 30, oriented substantially perpendicular to the magnetic recording medium 16, and having a tip 32. The tip 32 includes a bottom surface 34. The top 36 of the main pole 30 is magnetically coupled to an opposing pole 38, for example, through a joint 40. The opposing pole 38 includes a bottom surface 42. If perpendicular recording is desired, the bottom surface 42 will be substantially larger than the bottom surface 34. If longitudinal recording is desired, the bottom surfaces 42 and 34 may or may not have surface areas of similar size. An electrically conductive coil 44 is located adjacent to the main pole 30, and is dimensioned and configured to induce a magnetic flux in the main pole 30. The coil 44 is ordinarily surrounded by insulating material, as is well known in the art. It will be appreciated that the recording head 22 may be modified accordingly as is known in the art, such as, for example, to accommodate the type of read element being utilized, e.g., a current perpendicular to the plane read element or a current in the plane or parallel type element.

Located adjacent to the opposing pole 38, opposite the main pole 30 and coil 44, is a read element 46. The read element 46 of the present invention is a spin valve, operating in conjunction with the electrical contacts 48, 50 (electrical contact 50 shown in FIGS. 3–6) located on opposing sides of the read element 46. Although the electrical contacts 48, 50 are illustrated to provide current parallel to a plane defined by the layers of the spin valve 46, the present invention may also be used with electrical contacts 48, 50 providing current perpendicular to the layers of the spin valve 46. The read element 46 is also located between a pair of opposing magnetic shields. One magnetic shield may be formed by the opposing pole 38, and the other magnetic shield is designated by the reference number 54. The entire recording head 22 may be built upon a substrate 56.

Figure 3:
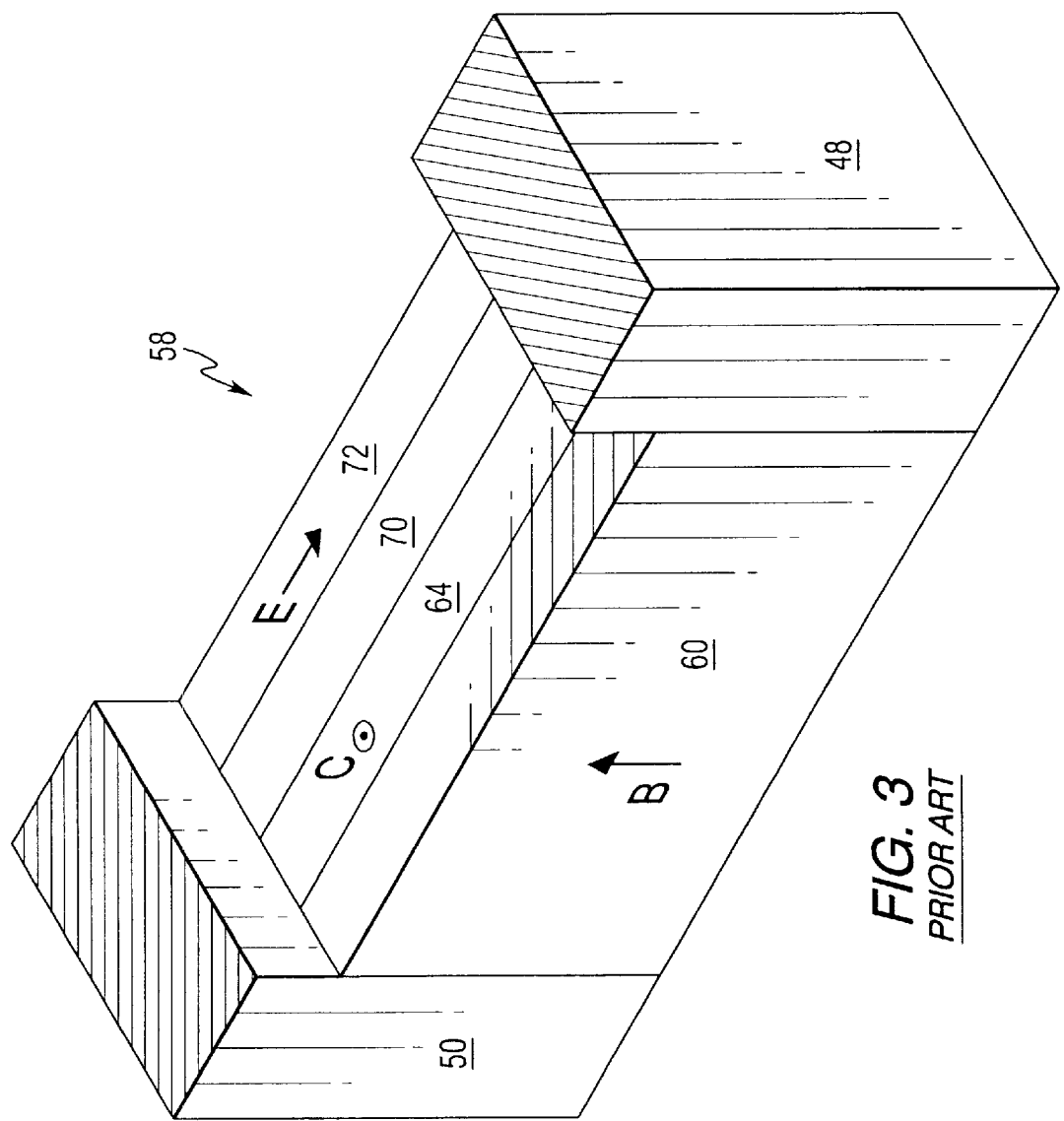
FIG. 3 is a partially schematic, isometric view of a prior art spin valve.

Referring to FIG. 3, a prior art spin valve is illustrated. The prior art spin valve 58 includes a layer of antiferromagnetic material 60, having a magnetic orientation perpendicular to the magnetic recording media 16, as indicated by the arrow B. The antiferromagnetic material in the layer 60 is a material that is not affected by external magnetic fields, and generally appears to be nonmagnetic. However, once subjected to high temperature, application of an external magnetic field to this material will permanently orient the preferential magnetic orientation of an adjacent material when it cools while the magnetic field is applied. A ferromagnetic pinned layer 64 is adjacent the antiferromagnetic layer 60, having a magnetic orientation parallel to the magnetic orientation in the antiferromagnetic layer 60 and set by the direction of the applied field during annealing of the antiferromagnetic material, as indicated by the arrow C. An electroconductive layer 70 is adjacent to the ferromagnetic pinned layer 64. A free ferromagnetic layer 72 is adjacent the electroconductive layer 70. The free layer 72 has a default magnetic orientation parallel to the magnetic recording media, as indicated by the arrow E.

Figure 4:
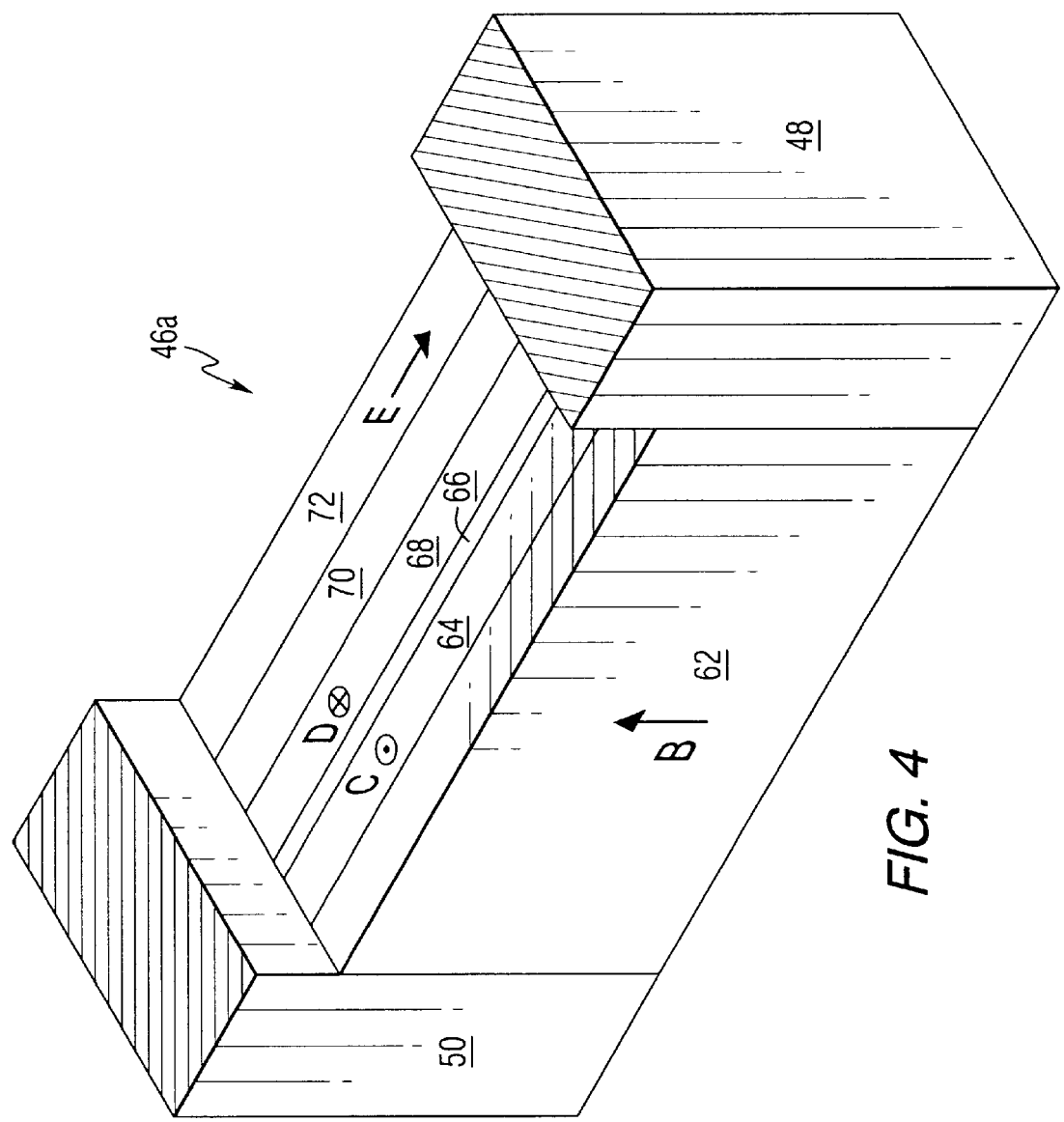
FIG. 4 is a partially schematic, isometric view of an embodiment of a spin valve according to the present invention.

One embodiment of the invention is illustrated in FIG. 4. Specifically, spin valve 46a includes a permanent magnet 62 on one side of the spin valve 46a. A ferromagnetic pinned layer 64 is adjacent to the permanent magnet 62. A coupling inducing layer 66 that induces antiferromagnetic coupling between the adjacent ferromagnetic pinned layer 64 and reference ferromagnetic layer 68, may be adjacent to the pinned layer 64. Materials known to induce antiferromagnetic coupling such as, for example, Ru, Rh and Cr, may be used to form coupling layer 66. An electroconductive layer 70, with a suggested material being copper, is adjacent to the reference layer 68. Lastly, a ferromagnetic free layer 72 is adjacent to the electroconductive layer 70. The pinned layer 64 may or may not be utilized in the spin valve 46a. However, an advantage of employing the pinned layer 64 is that the antiferromagnetic coupling between the permanent magnet 62 and the reference layer 68 is further enhanced.

An advantage of the spin valve 46a, as well as other embodiments described herein that employ the reference layer 68 is that magnetic flux from the permanent magnet 62 is able to pass through the reference layer 68 which is antiferromagnetically coupled to the permanent magnet 62. Otherwise, the magnetic flux from the permanent magnet 62 would tend to pass through the free layer 72 and alter the magnetic orientation thereof. This is illustrated in more detail with the embodiments illustrated in FIGS. 9 and 10 below.

The default orientations of the various magnetic moments within the spin valve 46a are also depicted in FIG. 4. The magnetic moment of the permanent magnet 62 will generally be oriented substantially perpendicular to the magnetic recording media 16, and in this case is oriented upward, as indicated by the arrow B. The orientation of the magnetic moment in the pinned layer 64 will correspond to the orientation of the magnetic moment in the permanent magnet 62. This magnetic field is indicated by the arrow C, parallel to the arrow B. The magnetic moment in the reference layer 68 is anti-parallel to the magnetic moment in the pinned layer 64, as indicated by the arrow D, pointing downward. The default orientation of the magnetic moment in the free layer 72 is parallel to the magnetic recording media 16, as indicated by the arrow E. The moment E of free layer 72 will then rotate accordingly with respect to, i.e. in reference to, the reference layer 68. A pair of electrodes 48, 50 are located on opposite sides of the spin valve 46a, dimensioned and configured to apply a test current in a direction parallel to a plane defined by any of the layers within the spin valve 60. However, it will be appreciated that the layers of the spin valve may also be constructed such that the current is applied in a direction that is perpendicular to the plane of the layers.

Figure 5:
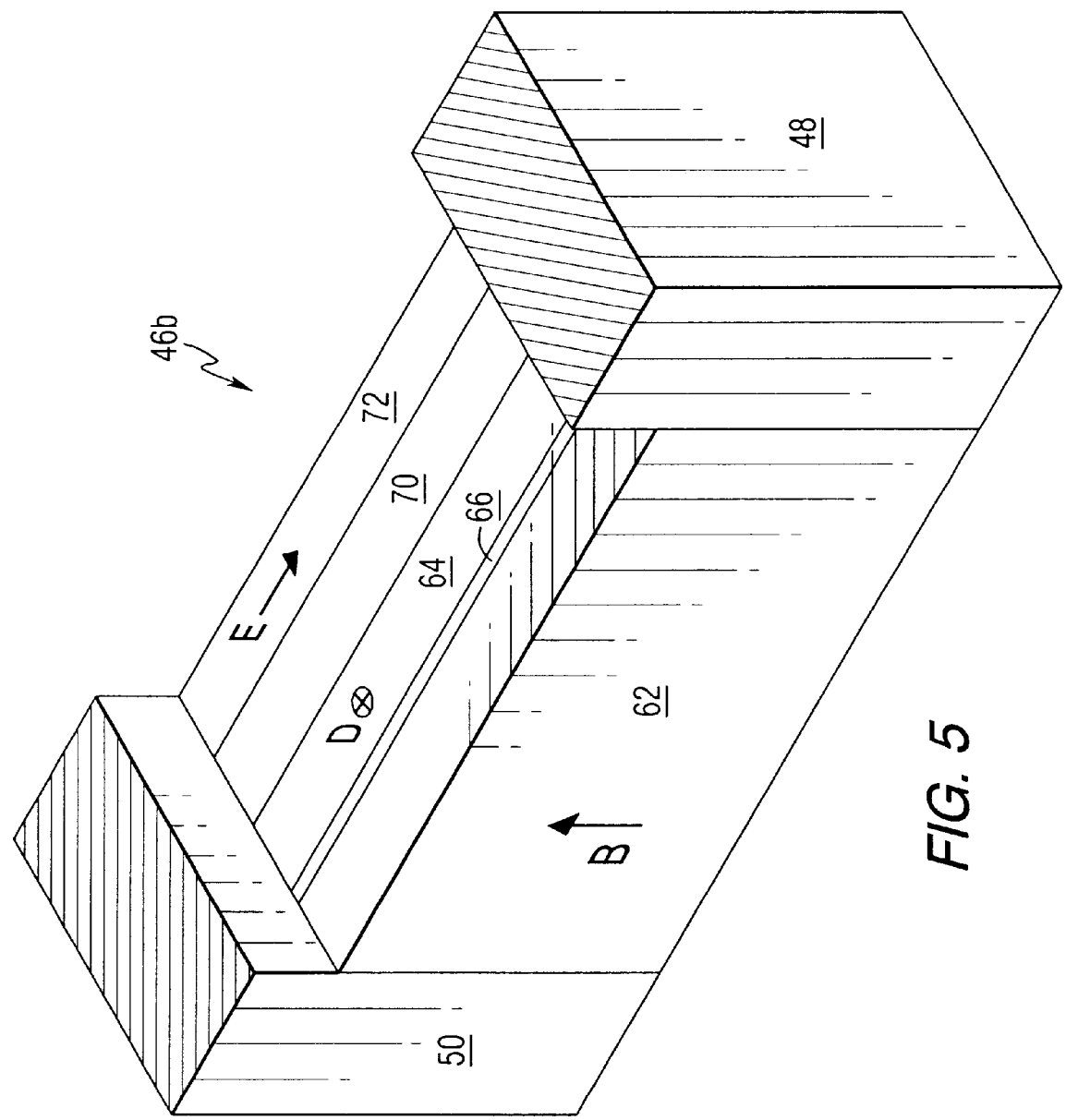
FIG. 5 is a partially schematic, isometric view of another embodiment of a spin valve according to the present invention.

Referring to FIG. 5, another embodiment of the invention, spin valve 46b, is illustrated. The spin valve 46b includes a permanent magnet 62, having a magnetic moment oriented perpendicular to the magnetic recording media 16, as indicated by the arrow B. A coupling layer 66 may be located adjacent to the permanent magnet 62. A ferromagnetic pinned layer 64 is located adjacent to the coupling layer 66 and has a magnetic moment oriented antiparallel to the magnetic moment of the permanent magnet 62, as indicated by the arrow D. An electroconductive layer 70 is adjacent the pinned layer 64. Lastly, a ferromagnetic free layer 72 is adjacent the electroconductive layer 70. The free layer 72 has a magnetic moment oriented parallel to the magnetic recording media 16, indicated by the arrow E. As before, the spin valve 46b is located between the opposing electrodes 48, 50, which are dimensioned and configured to apply a test current across the spin valve in a direction parallel (or perpendicular) to a plane defined by any of the layers.

Figure 6:
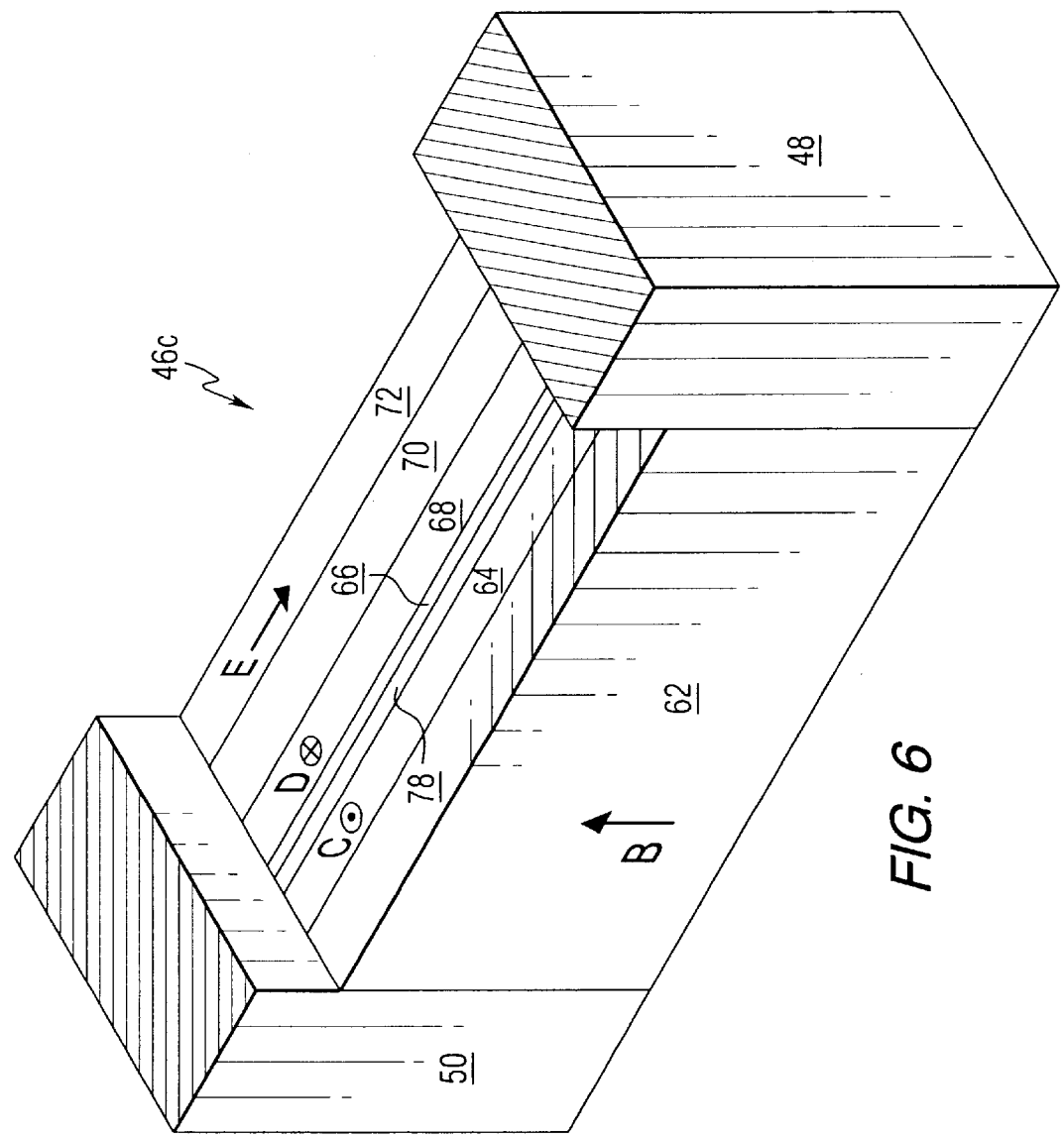
FIG. 6 is a partially schematic, isometric view of another embodiment of a spin valve according to the present invention.

Another embodiment of the invention, spin valve 46c, is illustrated in FIG. 6. As before, the spin valve 46c includes a permanent magnet 62, having a magnetic moment oriented perpendicular to the magnetic recording media 16, as indicated by arrow B. A ferromagnetic pinned layer 64 is directly adjacent to the permanent magnet 62, and has a magnetic moment parallel to the magnetic moment of the permanent magnet 62, as indicated by the arrow C. Immediately adjacent to the pinned layer 64 is layer 78, with a suggested material being Ta, to enhance the proper growth orientation of subsequent layers 66, 68, 70 and 72. A coupling layer 66 may be adjacent to the epitaxy breaking layer 78. A ferromagnetic reference layer 68 is adjacent to the coupling layer 66. The reference layer 68 has a magnetic moment anti-parallel to the magnetic moment of the pinned layer 64. This magnetic orientation is designated by the arrow D. Adjacent to the reference layer 68 is an electroconductive layer 70. A ferromagnetic free layer 72 is adjacent to the electroconductive layer 70. The free layer 72 has a magnetic moment oriented perpendicular to the magnetic recording media 68, as indicated by the arrow E. The magnetic moment in the free layer 72 is free to rotate under the influence of external magnetic fields.

Advantageously, the epitaxy breaking layer 78 is provided to break up the local epitaxy between the permanent magnet 62 and the other layers of the spin valve 46c, such as the coupling layer 66, the reference layer 68, the electroconductive layer 70 and/or the free layer 72. Without the epitaxy breaking layer 78, the magnetic properties in the other layers of the spin valve 46c, such as the magnetic properties of the reference layer 68 and/or the free layer 72 may be less than desirable. For example, use of the epitaxy breaking layer 78 results in the free layer 72 having a lower coercivity, which is an advantageous feature for the spin valve 246.

Embodiments of the spin valve 46 may also include a seed layer upon which the other layers of material are deposited, and a cap layer to protect the other layers of the device.

Referring back to FIG. 2, a magnetic storage medium 16, here a magnetic disc, for use with a recording head 22 is illustrated. The disc 16 includes a recording layer 80 having a plurality of magnetically permeable tracks 82, which are divided into sectors. Each sector has several different magnetic orientations within the magnetically permeable material (not shown and well understood). The tracks 82 are separated by nonmagnetized transitions 84. If perpendicular recording is desired, then the disc 16 also includes a magnetically permeable lower layer 86, which is magnetically soft relative to the tracks 82. In use, the disc 16 will be separated from the tip 32 of the main pole 30 by a flying height A. The flying height A is sufficiently small so that a high concentration of flux from the main pole 30 will pass through the tracks 82, but sufficiently large to prevent damage to the disc 16 from contact with the recording head 22.

Writing to the magnetic storage medium 16 is best explained referring to FIG. 2. The disc 16 is rotated relative to the recording head 22 so that the recording head 22 is located above the appropriate sectors of the track 82. As recording progresses, the disc 16 will move past the recording head 22. Current will be supplied to the coil 44, thereby inducing a magnetic field within the main pole 30. As a portion of the sector of the track 82 passes under the main pole 30, the orientation of its magnetic moment will correspond to the orientation of the magnetic moment of the main pole 30 in the case of perpendicular recording, or the orientation of the magnetic field within the write gap in the case of longitudinal recording. As the main pole passes over the disc 16, the direction of current passing through the coil 44 will remain constant when a binary "0" is being recorded, thereby creating consistent orientation of the magnetic fields within the track 82. The current passing through the coil 44 will reverse directions when a binary "1" is being recorded, thereby changing the orientation of a magnetic field within the track 82.

Reading from a magnetic recording medium 16 is also best illustrated with reference to FIG. 2. The magnetic recording medium 16 is passed under the recording head 22 so that a track 82 of the recording medium 16 passes under the read element 46. The sector of the track 82 directly under the read element 46 will be read. The magnetic fields within the track 82 directly underneath the read element 46 will be oriented either up or down if perpendicular recording is used, or forward and backward along the track if longitudinal recording is used. Depending on the orientation of the magnetic moment in the portion of the track 82 being read, the magnetic moment of the ferromagnetic free layer 72, designated by the arrow E, as described herein and shown, for example, in FIGS. 3–6, will be biased away from its default orientation to an orientation that is either parallel or anti-parallel to the orientation of the magnetic moment of the pinned layer 64, designated by the arrow C, as described herein and shown, for example, in FIGS. 3–6. When the magnetic moments designated by the arrows C and E are parallel, the spin valve 46 has its minimum resistance. When the magnetic fields designated by the arrows C and E are anti-parallel, the spin valve has its maximum resistance. The test current is applied through the electrical contacts 48, 50 to test the resistance of the read element 46. A constant level of resistance, regardless of whether that level of resistance is the minimum or maximum level, is interpreted as a binary "0." Similarly, a change in the level of resistance from minimum to maximum, or from maximum to minimum, is read as a binary "1."

Figure 7:
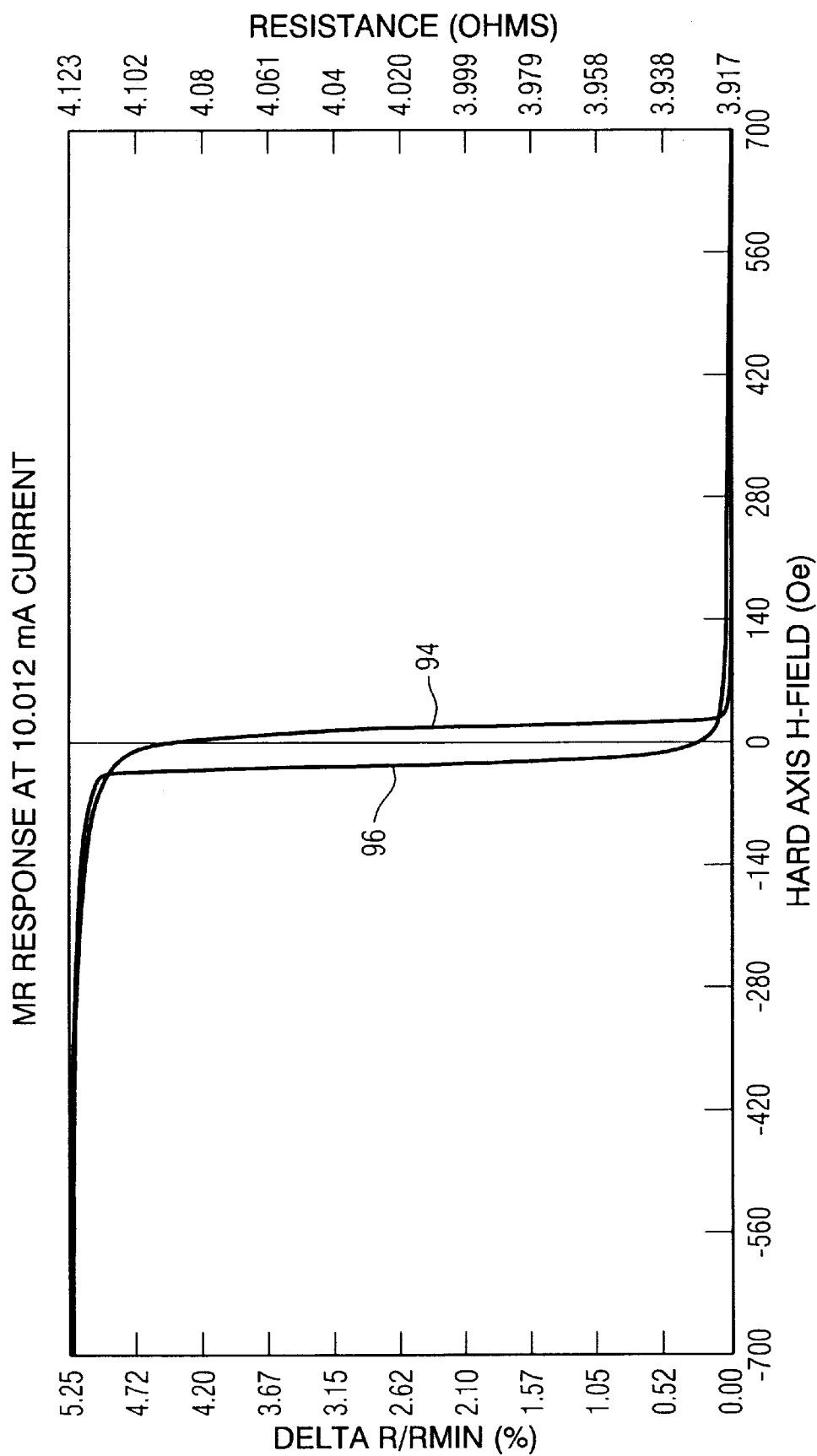
FIG. 7 is a graph illustrating magnetoresistive response as a function of magnetic fields for a spin valve according to the present invention.
Figure 8:
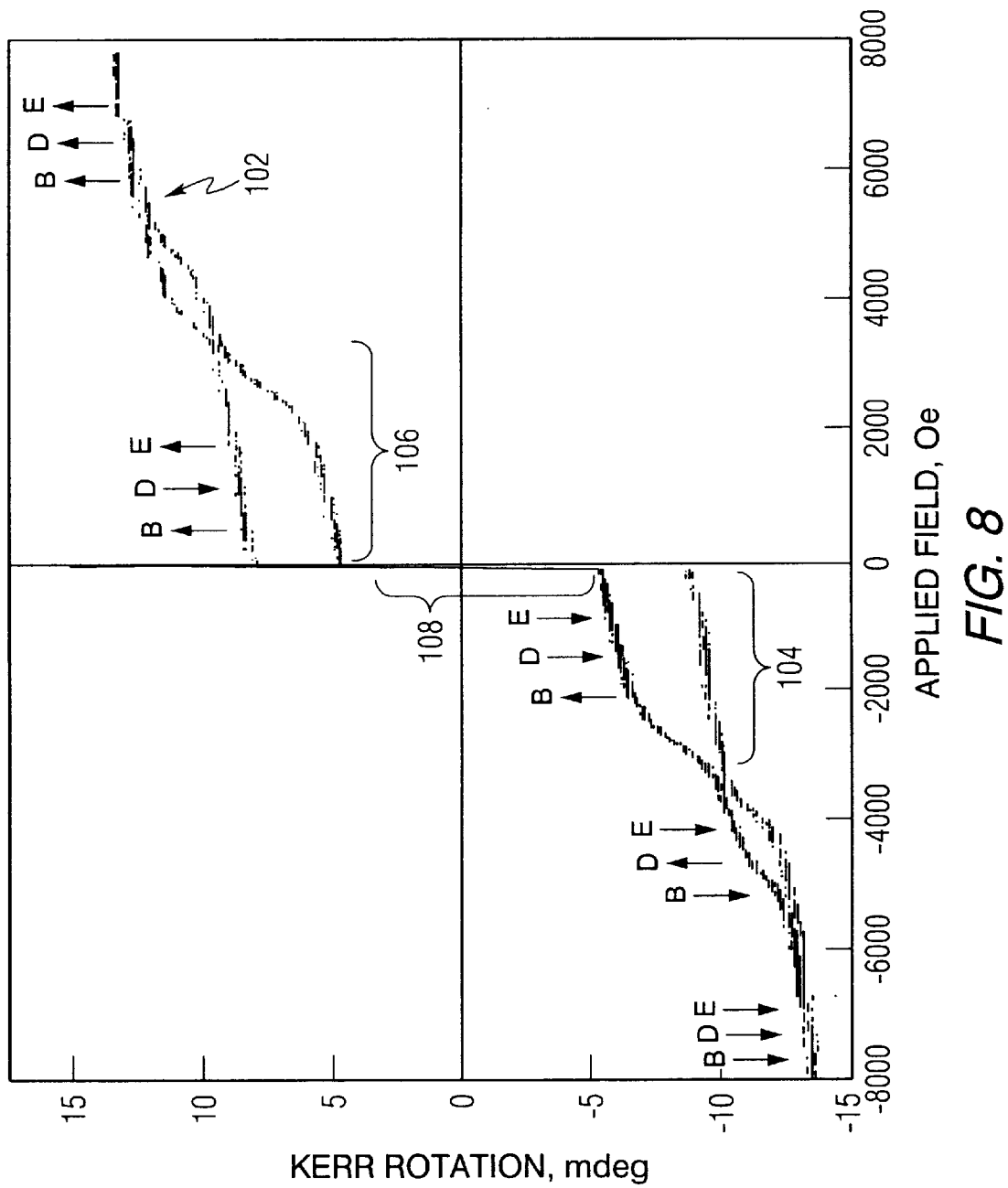
FIG. 8 is a graph illustrating Kerr rotation as a function of applied magnetic fields for a spin valve according to the present invention.

The magnetoresistive and magnetic properties of a spin valve 46 of the present invention are illustrated in FIGS. 7–8, respectively. Sensitivity of the GMR read element is maximized by maximizing the change in resistance as a function of applied magnetic field ($\Delta R$, or $R_{max}-R_{min}$), with respect to the total resistance (R, or $R_{min}$). Expressed differently, the quantity $\Delta R/R$, or $(R_{max}-R_{min})/R_{min}$ should be maximized. FIGS. 7 and 8 illustrate results obtained with a spin valve 46b of FIG. 5. FIG. 7 illustrates magnetoresistive response ($\Delta R/R$ and total resistance) as a function of applied magnetic field H along the free layer 72 hard axis. The graph illustrates a relatively large change in resistance with changing applied magnetic field. Additionally, a low coercivity is shown. Coercivity is the strength of the magnetic field necessary to switch the orientation of the magnetic field E in the free layer 72. In this case, it is indicated as approximately one-half the distance between the curve 94 and curve 96.

FIG. 8 illustrates Kerr rotation as a function of applied magnetic field. The arrows B, D, and E illustrate the magnetic orientations in the permanent magnet 62, pinned layer 64, and free layer 72, respectively, at various portions along the curve 102. The curve portions 104, 106 represent the maximum range of magnetic fields for which the spin valve 46b is usable. The relatively flat curve portions 104, 106, combined with the steep curve portion 108, indicate suitable magnetic properties within the spin valve 46b. The results illustrated in FIGS. 7 and 8 indicate the suitable magnetic and magnetoresistive properties of the spin valve 46b.

The spin valve 46 of the present invention has several important advantages over prior art spin valves. Permanent magnets are more corrosion resistant, and have better thermal stability, than antiferrogmagnetic materials. High temperature annealing processes, which tend to cause diffusion within the thin layers of read elements, are avoided. Permanent magnets have larger switching fields than antiferromagnetic-ferromagnetic bilayers. The total thickness of the read sensor is reduced by using a permanent magnet instead of an antiferromagnetic-ferromagnetic bilayer.

Figure 9:
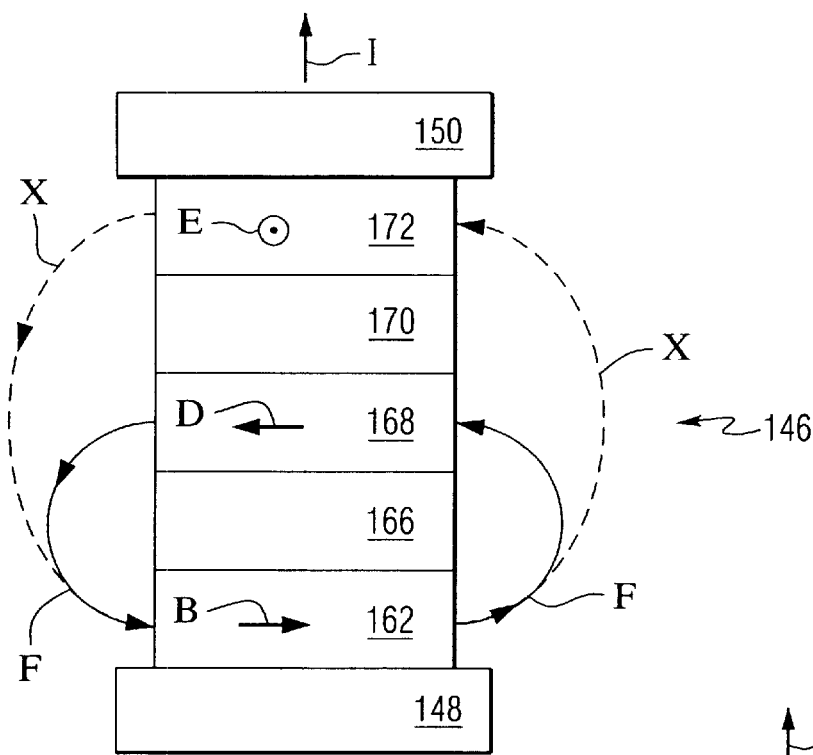
FIG. 9 is a schematic view of an embodiment of a spin valve according to the present invention.

Referring to FIG. 9, there is illustrated another embodiment of the invention. Specifically, there is shown a multilayer spin valve 146. On opposing ends of the multilayer spin valve 146 are electrical contacts 148, 150 which are structured and arranged for applying a current to the spin valve 146 in a direction, as illustrated, that is generally perpendicular to the plane of the layers that make up the spin valve 146, i.e., the spin valve 146 is illustrated as a current perpendicular to the plane (CPP) type spin valve, but it will be appreciated that the spin valve 146 may be also constructed in the form of a current parallel to the plane or current in-plane (CIP) type spin valve as well. Arrows I are provided to indicate the direction of current flow through the spin valve 146 and the electrical contacts 148, 150.

Still referring to FIG. 9, the spin valve 146 includes a permanent magnet layer 162. The permanent magnet 162 is utilized in place of a layer of antiferromagnetic material which is commonly used in a spin valve arrangement. The permanent magnet 162 has a magnetic orientation in the direction of arrow B.

The spin valve 146 also includes a coupling inducing layer 166 positioned adjacent the permanent magnet layer 162. The coupling inducing layer 166 may be formed of a material such as, for example, Ru, Rh and Cr. The spin valve 146 also includes a reference ferromagnetic layer 168 positioned adjacent the coupling inducing layer 166. The coupling inducing layer 166 facilitates antiferromagnetic coupling between the permanent magnet layer 162 and the reference ferromagnetic layer 168 which has a magnetic orientation in the direction indicated by arrow D.

The spin valve 146 also includes an electroconductive layer 170 adjacent the reference ferromagnetic layer 168 and a free ferromagnetic layer 172 positioned adjacent the electroconductive layer 170. The electroconductive layer 170 may be formed of a material such as, for example, Cu, Au, Ag or an alloy consisting of at least one of Cu, Au or Ag. The free layer 172, which is also positioned adjacent the electrical contact 150, has a magnetic orientation in the direction indicated by arrow E, i.e., the magnetic orientation of the free layer 172 is generally perpendicular to the direction of the reference layer 168 magnetic orientation D and the permanent magnet layer 162 magnetic orientation B. The magnetic orientation E of free layer 172 rotates accordingly with respect to, i.e. in reference to, the reference layer 168.

Still referring to FIG. 9, an advantage of the spin valve 146 is that magnetic flux F from the permanent magnet 162 is able to pass through the reference layer 168 which is antiferromagnetically coupled to the permanent magnet layer 162. Without the reference layer 168, the magnetic flux F from the permanent magnet layer 162 would pass through the free ferromagnetic layer 172 as indicated by the dotted line X resulting in the magnetic orientation of the free layer 172 being altered and, therefore, affecting the ability of the spin valve 146 to properly function. This is a problem that is similar to a known spin valve arrangement, such as illustrated in FIG. 3 above, wherein magnetic flux from the pinned layer adjacent the antiferromagnetic material is allowed to affect the magnetic orientation of the free layer.

Figure 10:
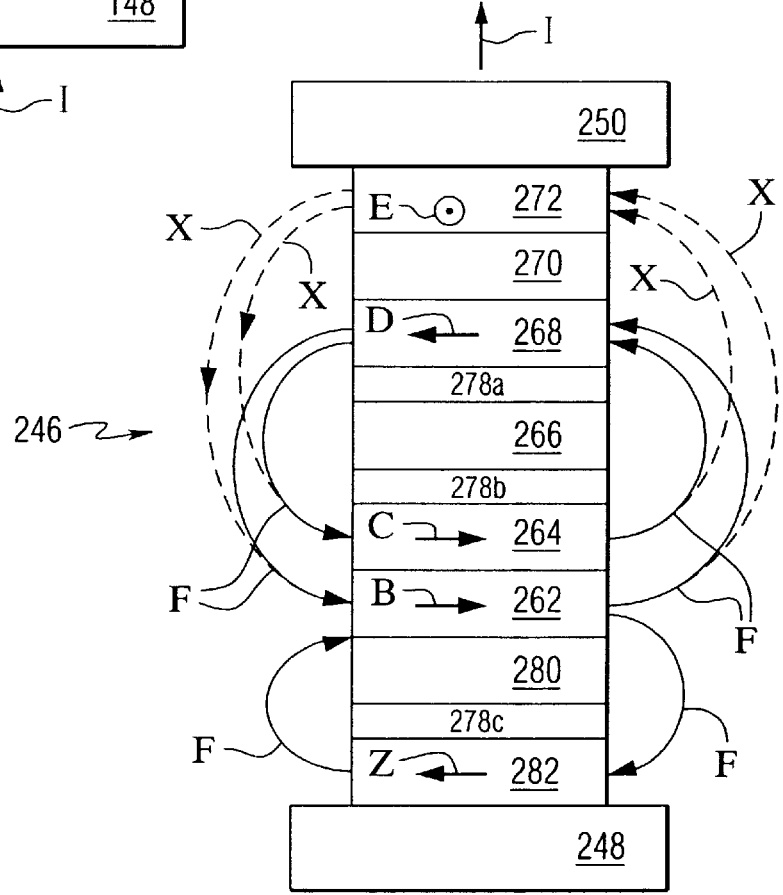
FIG. 10 is a schematic view of an additional embodiment of a spin valve of the present invention.

Referring to FIG. 10, there is illustrated another embodiment, spin valve 246, of the present invention. The spin valve 246 is a multilayer spin valve arrangement with certain layers thereof being similar in function to the layers that make up other spin valve embodiments, as described herein. For example, spin valve 246 includes a permanent magnet layer 262 having a magnetic orientation in the direction of arrow B. Spin valve 246 also includes reference layer 268 having a magnetic orientation in the direction of arrow D and a coupling inducing layer 266 for antiferromagnetically coupling the permanent magnet layer 262 and the reference layer 268. In addition, the spin valve 246 includes an electroconductive layer 270 and a free ferromagnetic layer 272 having a magnetic orientation in the direction of arrow E.

Still referring to FIG. 10, the spin valve 246 may also include a pinned ferromagnetic layer 264 adjacent the permanent magnet layer 262. The pinned ferromagnetic layer 264 has a magnetic orientation generally in the direction indicated by arrow C, which as shown is generally in the same direction as the magnetic orientation B of the permanent magnet 262. The pinned layer 264 may or may not be utilized in the spin valve 246. However, one advantage of employing the pinned layer 264 is that the antiferromagnetic coupling between the permanent magnet layer 262 and the reference layer 268 is enhanced.

The spin valve 246 may also include an epitaxy breaking layer 278a and /or 278b. As shown, the epitaxy breaking layer 278a may be positioned adjacent the reference layer 268 and the epitaxy breaking layer 278b may be positioned adjacent the pinned layer 264. In addition, an epitaxy breaking layer may be positioned between the permanent magnet layer 262 and the pinned layer 264. A function of the epitaxy breaking layers 278a, 278b, or other such layers that may be utilized, is to break up the local epitaxy between the permanent magnet layer 262 and the other layers, such as the reference layer 268 and the free layer 272. Without the epitaxy breaking layer 278a and/or 278b, the magnetic properties in the other layers of the spin valve, such as the magnetic properties of the reference layer 268 and/or the free layer 272, are less than desirable. For example, use of the epitaxy breaking layer 278a and/or the epitaxy breaking layer 278b results in the free layer 272 having a lower coercivity, which is an advantageous feature for the spin valve 246. The epitaxy breaking layer 278a and 278b may be formed of a material such as, for example, Ta, Zr or Nb.

An advantage of the spin valve 246 is that magnetic flux F from the permanent magnet layer 262 and the pinned layer 264 passes through the reference layer 268. This prevents the magnetic flux F from the permanent magnet 262 and the pinned layer 264 from passing through the free layer 272, as indicated by dotted lines X, and altering the magnetic orientation of the free layer 272.

Still referring to FIG. 10, the spin valve 246 may also include a seed layer 280 positioned adjacent the permanent magnet layer 262. The seed layer may be formed of a material such as, for example, Cr, W, TiW or MgO. The spin valve may also include a flux shunt layer 282 formed adjacent the seed layer 280. The flux shunt layer has a magnetic orientation in the direction indicated by arrow Z. An additional epitaxy breaking layer 278c may be provided between the seed layer 280 and the flux shunt layer 282. Similar to the epitaxy breaking layers 278a, 278b, the epitaxy breaking layer 278c breaks up the local epitaxy between the permanent magnet layer 262 and the flux shunt layer 282 resulting in improved magnetic properties for the permanent magnet layer 262. An advantage of the flux shunt layer 282 is that the magnetic flux F from the permanent magnet 262 is allowed to pass therethrough. This further reduces the possibility of stray magnetic flux being able to pass through the free layer 272 and affecting the magnetic orientation thereof. The flux shunt layer 282 may include a ferromagnetic layer pinned by an antiferromagnetic material or a ferromagnetic material antiferromagnetically coupled to the permanent magnet 262 through a coupling layer similar to coupling layer 266.

The flux shunt layer 282 may be formed of a material such as, for example, NiFe, CoFe, NiCoFe or an alloy consisting of at least one of Ni, Co or Fe.

While a specific embodiment of the invention has been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalence thereof.

What is claimed is:

1. A spin valve, comprising:

a permanent magnet layer;

a reference ferromagnetic layer;

a coupling inducing layer positioned between said permanent magnet layer and said reference ferromagnetic layer;

an epitaxy breaking layer positioned adjacent to the coupling inducing layer;

a free ferromagnetic layer; and an electroconductive layer positioned between said free layer and said reference ferromagnetic layer.

2. The spin valve of claim 1, wherein the coupling inducing layer is formed of a material selected from the group consisting of Ru, Rh and Cr.

3. The spin valve of claim 1, wherein said coupling inducing layer provides antiferromagnetic coupling between said permanent magnet layer and said reference ferromagnetic layer.

4. The spin valve of claim 1, wherein said electroconductive layer is formed of Cu, Au, Ag or an alloy consisting of at least one of Cu, Au or Ag.

5. The spin valve of claim 1, further including a pinned ferromagnetic layer positioned between said permanent magnet layer and said coupling inducing layer.

6. The spin valve of claim 5, further including an epitaxy breaking layer positioned between said coupling inducing layer and said pinned ferromagnetic layer.

7. The spin valve of claim 6, wherein said epitaxy breaking layer is formed of a material selected from the group consisting of Ta, Zr or Nb.

8. The spin valve of claim 1, wherein the epitaxy breaking layer is positioned between said coupling inducing layer and said reference ferromagnetic layer.

9. The spin valve of claim 1, wherein said epitaxy breaking layer is formed of a material selected from the group consisting of Ta, Zr or Nb.

10. The spin valve of claim 1, further including a seed layer positioned adjacent said permanent magnet layer, said seed layer formed on an opposing side of said permanent magnet layer from said coupling inducing layer.

11. The spin valve of claim 10, wherein said seed layer is formed of a material selected from the group consisting of Cr, W, TiW, or MgO.

12. The A spin valve comprising:

a permanent magnet layer;

a reference ferromagnetic layer;

a coupling inducing layer positioned between said permanent magnet layer and said reference ferromagnetic layer;

a free ferromagnetic layer;

an electroconductive layer positioned between said free layer and said reference ferromagnetic layer;

a seed layer positioned adjacent said permanent magnet layer, said seed layer formed on an opposing side of said permanent magnet layer from said coupling inducing layer;

a flux shunt layer; and an epitaxy breaking layer positioned between said flux shunt layer and said seed layer.

13. A magnetic disc drive storage system, comprising:

a housing;

a rotatable magnetic storage medium positioned in said housing; and a recording head mounted in said housing adjacent said rotatable magnetic storage medium, said recording head having a spin valve, said spin valve comprising:
  a permanent magnet layer;
  a reference ferromagnetic layer;
  a coupling inducing layer positioned between said permanent magnet layer and said reference ferromagnetic layer;
  an epitaxy breaking layer positioned adjacent to the coupling inducing layer;
  a free ferromagnetic layer; and
  an electroconductive layer positioned between said free layer and said reference ferromagnetic layer.

14. The system of claim 13, further including a first electrical contact positioned adjacent said permanent magnet layer and a second electrical contact positioned adjacent said free ferromagnetic layer wherein said first and second electrical contacts are structured and arranged to provide a current that passes through said spin valve in a direction that is generally perpendicular to a plane defined by said layers of said spin valve.

15. The system of claim 13, wherein said spin valve is structured and arranged such that a current that passes through said spin valve passes in a direction that is generally parallel to a plane defined by said layers of said spin valve.

16. The system of claim 13, further including a pinned ferromagnetic layer positioned between said permanent magnet layer and said coupling inducing layer.

17. The system of claim 13, wherein the epitaxy breaking layer is positioned between said coupling inducing layer and said pinned ferromagnetic layer.

18. The system of claim 13, wherein the epitaxy breaking layer is positioned between said coupling inducing layer and said reference ferromagnetic layer.

19. A current perpendicular to the plane spin valve, comprising:

a permanent magnet layer;

a pinned ferromagnetic layer adjacent said permanent magnet layer;

an antiferromagnetic coupling inducing layer adjacent said pinned ferromagnetic layer;

a reference ferromagnetic layer adjacent said antiferromagnetic coupling inducing layer;

an electroconductive layer adjacent said reference ferromagnetic layer;

a free ferromagnetic layer adjacent said electroconductive layer; and an epitaxy breaking layer positioned between said pinned ferromagnetic layer and said antiferromagnetic coupling inducing layer and/or between said antiferromagnetic coupling inducing layer and said reference ferromagnetic layer.

20. A magnetic device, comprising:

a multilayer magnetic structure, comprising:
  a permanent magnet layer;
  a reference ferromagnetic layer;
  a coupling inducing layer positioned between said permanent magnet layer and said reference ferromagnetic layer;
  an epitaxy breaking layer positioned adjacent to the coupling inducing layer;
  a free ferromagnetic layer; and
  an electroconductive layer positioned between said free layer and said reference ferromagnetic layer.

21. The magnetic device of claim 20, further including a pinned ferromagnetic layer positioned between said permanent magnet layer and said coupling inducing layer.

22. The magnetic device of claim 20, wherein the epitaxy breaking layer is positioned between said coupling inducing layer and said reference ferromagnetic layer.

23. The magnetic device of claim 20, wherein said multilayer magnetic structure is employed in a magnetoresistive random access memory device.

* * * * *

UNITED STATES PATENT AND TRADEMARK OFFICE
CERTIFICATE OF CORRECTION

PATENT NO. : 6,754,054 B2
DATED : June 22, 2004
INVENTOR(S) : Michael A. Seigler, Paul E. Anderson and Alexander M. Shukh It is certified that error appears in the above-identified patent and that said Letters Patent is hereby corrected as shown below:

Column 1,
Line 8, "patent application" should read -- Patent Application -- (should be initial caps).

Column 2,
Line 50, "a Ru layer" should read -- an Ru layer --.

Column 11,
Line 21, "and /or" should read -- and/or --.

Column 12,
Line 65, "The A" should read -- A --.

Signed and Sealed this

Thirteenth Day of December, 2005

JON W. DUDAS
*Director of the United States Patent and Trademark Office*